United States Patent
Yu et al.

(10) Patent No.: US 11,078,907 B2
(45) Date of Patent: Aug. 3, 2021

(54) SCROLL TYPE MICRO-COMPRESSOR, AND METHOD FOR MACHINING FIXED SCROLL PLATE AND ORBIT SCROLL PLATE THEREOF

(71) Applicant: Beijing University of Chemical Technology, Beijing (CN)

(72) Inventors: Duli Yu, Beijing (CN); Xiaoxing Xing, Beijing (CN); Chaomin Zhang, Beijing (CN)

(73) Assignee: BEIJING UNIVERSITY OF CHEMICAL TECHNOLOGY, Beijing (CN)

( * ) Notice: Subject to any disclaimer, the term of this patent is extended or adjusted under 35 U.S.C. 154(b) by 241 days.

(21) Appl. No.: 16/525,431

(22) Filed: Jul. 29, 2019

(65) Prior Publication Data

US 2020/0149530 A1    May 14, 2020

(30) Foreign Application Priority Data

Nov. 8, 2018   (CN) .......................... 201811323362.9
Nov. 8, 2018   (CN) .......................... 201811323370.3

(51) Int. Cl.
*F04C 18/02*   (2006.01)
*B81C 1/00*   (2006.01)

(52) U.S. Cl.
CPC ...... *F04C 18/0215* (2013.01); *B81C 1/00087* (2013.01); *F04C 18/0253* (2013.01); *F04C 18/0269* (2013.01); *F04C 18/0292* (2013.01); *F04C 2230/10* (2013.01)

(58) Field of Classification Search
CPC .............. F04C 18/0215; F04C 18/0253; F04C 18/0269; F04C 18/0292; F04C 18/0246
See application file for complete search history.

(56) References Cited

U.S. PATENT DOCUMENTS

| | | | | |
|---|---|---|---|---|
| 5,762,483 A | * | 6/1998 | Lifson | F04C 18/0292 418/55.5 |
| 10,215,451 B2 | * | 2/2019 | Fujitaka | C09K 5/045 |
| 2001/0038797 A1 | * | 11/2001 | Makino | H02K 1/185 417/410.1 |

(Continued)

FOREIGN PATENT DOCUMENTS

CN            101456532 A      6/2009

*Primary Examiner* — Deming Wan
(74) *Attorney, Agent, or Firm* — Tope-McKay & Associates

(57) ABSTRACT

The embodiments of the present disclosure disclose a scroll type micro-compressor, and a method for machining a fixed scroll plate and an orbit scroll plate thereof. The scroll type micro-compressor comprises a fixed scroll plate and an orbit scroll plate each integrally made with a monocrystalline silicon substrate; the compressor device has an Oldham ring structure, and reduces a mass of the orbit scroll plate by optimizing a design of a substrate of the orbit scroll plate; a cross-sectional shape of a plurality of micropores provided on a lower surface of the fixed scroll plate is set as of a fan ring, in which an electrode material is accommodated to maintain an electric field uniformity and reduce an electric field loss; and hydrophilia of inner surfaces is changed to prevent a top leakage and facilitate capillary filling of a compression chamber.

12 Claims, 8 Drawing Sheets

(56) References Cited

U.S. PATENT DOCUMENTS

2007/0104603 A1\* 5/2007 Zhou .................. F04C 18/0246
418/55.2
2010/0202911 A1\* 8/2010 Ni ..................... B29C 45/14836
418/55.2
2011/0103990 A1\* 5/2011 Chikano ............. F04C 18/0246
418/55.2
2011/0243777 A1\* 10/2011 Ito ........................ F04C 27/005
418/55.2

\* cited by examiner

A distance from an edge of a micropore to a scroll wall is constant.

A distance from an edge of a micropore to a scroll wall is non-uniform in the prior art.

SCROLL TYPE MICRO-COMPRESSOR, AND METHOD FOR MACHINING FIXED SCROLL PLATE AND ORBIT SCROLL PLATE THEREOF

CROSS-REFERENCE TO RELATED APPLICATIONS

This application claims priority to Chinese Patent Application No. 201811323370.3, filed on Nov. 8, 2018 and Chinese Patent Application No. 201811323362.9, filed on Nov. 8, 2018, both of which are hereby incorporated by reference in its entirety.

TECHNICAL FIELD

The present disclosure belongs to the technical field of compressors, and particularly relates to a scroll type micro-compressor and a method for machining a fixed scroll plate and an orbit scroll plate thereof.

BACKGROUND ART

A scroll type compressor comprises a pair of intermeshed, spiral-shaped scroll components, and compresses gases or liquid by causing an eccentric gyratory translation of a uniquely movable component, i.e., an orbit scroll, with respect to a fixed scroll which is held stationary. Such a concise design with less movable components makes the scroll type compressor be favorable over other compressors, such as a rotary-screw compressor or a reciprocating compressor, for being more efficient, mechanical-structurally reliable and low noise. In fact, the invention of the scroll type compressor dates back to more than 110 years ago. However, since the machining of the components of the scroll type compressor requires an extremely-high precision (a few micrometers) machining technique, the scroll type compressor did not come into practice until the application of the computer numeric control (CNC) technique in early 1970s. Today, the scroll type compressor has been widely applied from residential to commercial and achieved great success, concerning the systems of air conditioning, refrigeration, vacuum, etc., as well as the train braking system in the transportation industry.

Nowadays, the technical development trends towards integration and miniaturization in the existing electronic industry and the development of the advanced biochemical analysis instruments bring high requirements on the micro compressor components. For instance, the advanced microprocessor with a high-power density requires integrated cooling components with fast heat dissipation rates; a vacuum chamber is indispensable in the systems such as a micro mass spectrometer, a high intensity laser and the like; and a micro pump for high precision pumping and control of fluids is an essential part in the micro total analysis system and the on-site point-of-care testing devices. The micro electro mechanical system (MEMS) allows an extremely-high precision machining of microscopic components using a micro-machining technique based on a large-scale integrated circuit technology. The scroll type micro-compressor adopting a MEMS machining technology inherits the advantages of the macro type scroll compressor, while satisfying the high precision requirement of scroll machining, thereby exhibiting great potentials in the micro-scale compressor. Currently, there are very limited reports on the design and implementation method of such scroll type compressor based on the micromachining technique. The California Jet Propulsion Laboratory of the National Aeronautics and Space Administration and the University of Southern California have collaborated on a method for machining a high depth-to-width ratio scroll wall using a LIGA technology, but the disadvantage of this method lies in a high cost of X-ray LIGA.

The Chinese patent document with a Chinese patent number of CN200810177003.7 initially discloses an operating mechanism of the electrostatic driven micro scroll compressor based on a MEMS technique, and proposes a machining method for implementing the device on a silicon-on-insulator (SOI) substrate. But the structure is not designed with any structure to prevent the autogiration of the orbit scroll plate, the adopted electrostatically driven electrode is a cylindrical structure, the electric field uniformity is poor and the driving voltage loss is large; in addition, the compression efficiency of the compressor is affected by both the top leakage and the side leakage, while in the two leakage mechanisms, the top leakage affects the compressor efficiency more seriously. The capillary action of the liquid becomes significant in the minute structure, and during operation of the compressor, a top leakage risk will be caused by tiny gaps existing under conditions when the top of the orbit scroll wall/the upper surface of the fixed scroll plate substrate and the top surface of the fixed scroll wall/the upper surface of the orbit scroll plate substrate are not completely sealed, so the compressed liquid can easily enter the tiny gaps under the capillary action. Besides, the machining technology uses the SOI substrate which is expensive.

SUMMARY OF THE INVENTION

The present disclosure discloses a scroll type micro-compressor integrated on a monocrystalline silicon substrate, which introduces an Oldham ring structure in the scroll type micro-compressor for the first time, and reduces a load mass of an electrostatically driven orbit scroll plate by optimizing a shape of an orbit scroll plate substrate. As to the problems of the non-uniform electrostatically driving electric field and the voltage loss, the present disclosure improves the shape design of the pores, and proposes to change hydrophilia of inner surfaces to prevent a top leakage and facilitate capillary filling of a compression chamber. In terms of implementation, the present disclosure contains a detailed technological process for a scroll micro-compressor based on a monocrystalline silicon substrate.

In order to achieve the above objective, the present disclosure adopts the following technical solutions.

A scroll type micro-compressor, comprising a fixed scroll plate and an orbit scroll plate each integrally made with a monocrystalline silicon substrate; the fixed scroll plate comprises: a fixed scroll plate substrate; a fixed scroll wall integrally formed on an upper surface of the fixed scroll plate substrate; and an annular shell integrally formed on the upper surface of the fixed scroll plate substrate and located outside the fixed scroll wall, wherein a side of the annular shell is provided with an inlet, and an upper surface of the annular shell is provided with a pair of cylindrical keyways radially and symmetrically distributed with respect to the fixed scroll wall; wherein a plurality of micropores uniformly distributed along the fixed scroll wall are provided to extend from a lower surface of the fixed scroll plate substrate into the fixed scroll wall through the fixed scroll plate substrate, the micropores being filled with electrode materials connected by wires to pads provided respectively on the lower surface of the fixed scroll plate substrate and close to edges of the fixed scroll plate substrate, a cross-sectional shape of the micropore being a fan ring, points on an inner arc edge of the fan ring being equidistant from an inside edge of the fixed scroll wall, and points on an outer arc edge of the fan ring being equidistant from an outside edge of the fixed scroll wall; and wherein a through-hole is provided on the fixed scroll plate substrate and at a center of the fixed scroll wall as a discharge port; wherein the orbit scroll plate comprises: an orbit scroll plate substrate, comprising a circular body portion and a pair of short arms coplanar with the circular body portion and provided to radially extend from two ends of a diameter of the circular body portion, either of the two short arms being provided with a raised cylindrical insertion key; and an orbit scroll wall provided on an upper surface of the orbit scroll plate substrate; and wherein a distance between central axes of the two cylindrical insertion keys is equal to a distance between central axes of the two cylindrical keyways, and a cross-sectional diameter of the cylindrical insertion key is smaller than a cross-sectional diameter of the cylindrical keyway, so that the insertion key is inserted into a corresponding keyway, and wherein the insertion key and the keyway form an Oldham ring structure to prevent an autogiration of the orbit scroll plate.

In an embodiment of the present disclosure, a scroll type micro-compressor based on a monocrystalline silicon substrate comprises an orbit scroll plate and a fixed scroll plate each machined using a monocrystalline silicon substrate; a lower surface of a square substrate of the fixed scroll plate is provided with micropores featuring a high depth-to-width ratio for filling of an electrostatically driven electrode, and an upper surface of the substrate of the fixed scroll plate is integrally provided with a raised fixed scroll wall; a plurality of micropores uniformly distributed along the fixed scroll wall are provided to extend from the lower surface of the fixed scroll plate substrate into the fixed scroll wall through the fixed scroll plate substrate, for filling of an electrostatically driven electrode; a cross-sectional shape of the micropore is a fan ring, and inner and outer arc edges of the fan ring are each equidistant from corresponding edge of the fixed scroll wall, i.e., points on the inner arc edge of the fan ring are equidistant from an inside edge of the fixed scroll wall, and points on the outer arc edge of the fan ring are equidistant from an outside edge of the fixed scroll wall; the fan ring-shaped micropores are extended from the fixed scroll plate substrate into the fixed scroll wall, filled with an electrode material, and connected to the pads by wires; a through-hole is provided on the fixed scroll plate substrate and at a center of the fixed scroll wall as a discharge port; an annular shell is provided on the upper surface of the fixed scroll plate substrate and located outside the fixed scroll wall, and a side of the annular shell is provided with an inlet; an upper end face of the annular shell is provided with a pair of cylindrical keyways radially and symmetrically distributed with respect to the fixed scroll wall; an upper surface of a circular planar orbit scroll plate substrate is integrally provided with a raised orbit scroll wall; a pair of short arms are provided to radially extend from two ends of a diameter of the circular planar orbit scroll plate substrate, and either of the two short arms is provided with a raised cylindrical insertion key; a distance between centers of the two insertion keys is equal to a distance between centers of the two cylindrical keyways, and the insertion key is inserted into a corresponding keyway; a diameter of the insertion key is smaller than a diameter of the keyway; the insertion key and the keyway form an Oldham ring structure to prevent an autogiration of the orbit scroll plate; and the shape of the orbit scroll plate substrate is optimized to reduce the mass of the orbit scroll plate, including a minimized circular body portion connected to a pair of radially symmetric coplanar short arms for accommodating the Oldham ring insertion key, thereby reducing the mass of the load under electrostatic driving.

In an embodiment of the present disclosure, the orbit scroll plate and the fixed scroll plate may be subjected to surface treatments, so that sidewall surfaces of the scroll walls and upper surfaces of the substrates of the orbit scroll plate and the fixed scroll plate are hydrophilic, while top surfaces of the scroll walls are hydrophobic. The Chinese patent document with a Chinese patent number of CN200810177003.7 discloses an operating mechanism of the electrostatic driven micro scroll compressor, and the micro scroll compressor has its structures integrated within monocrystalline silicon. The compression efficiency of the compressor is affected by both the top leakage and the side leakage, while in the two leakage mechanisms, the top leakage affects the compressor efficiency more seriously. The capillary action of the liquid becomes significant in the minute structure, and during operation of the compressor, a top leakage risk will be caused by any tiny gaps due to that the top surface of the orbit scroll wall/the upper surface of the fixed scroll plate substrate and the top surface of the fixed scroll wall/the upper surface of the orbit scroll plate substrate are not completely sealed, so the compressed liquid can easily enter the tiny gaps under the capillary action. The hydrophobic treatment of the top surface of the scroll wall is favorable for limiting the top leakage caused under the capillary action, while the hydrophilicity of the inner wall of the compression chamber (the side surface of the scroll wall and the upper surface of the substrate) is favorable for restricting the liquid in the compression chamber, thereby improving the compression efficiency. In addition, the hydrophilicity of the inner wall of the compression chamber is favorable for the filling and the inner wall modification of the compression chamber by the capillary action. The method for the hydrophilic surface treatment includes, but not limited to, the silica deposition; and the hydrophobic surface treatment includes, but not limited to, grinding polished silicon, applying hydrophobic polymer coating, and the like.

The shape of the orbit scroll plate substrate is optimized to reduce the mass of the orbit scroll plate, including a minimized circular body portion connected to a pair of radially symmetric coplanar short arms for accommodating the Oldham ring insertion key, wherein a radius of the minimized circular body portion satisfies the following constraint:

$$r_{min} > r_0\sqrt{1+(\theta+\pi)^2} - t_{wall}/2$$

wherein θ is an angle from a start point to a tail end of the scroll.

A micro-machining method for an orbit scroll plate based on a monocrystalline silicon wafer start with defining shapes of the orbit scroll wall and the Oldham ring insertion key on an upper surface of the monocrystalline silicon wafer by photolithography, followed by anisotropic etching of silicon to a designated depth; next a shape of the orbit scroll plate substrate outlined by a narrow channel on a lower surface of the monocrystalline silicon wafer is defined by a second step of photolithography, followed by releasing the orbit scroll plate entirely by anisotropic etching of silicon through the monocrystalline silicon wafer.

The micropore of the present disclosure adopts a cross-sectional shape design of a fan ring, wherein inner and outer arc edges of the fan ring are each equidistant from corresponding edge of the fixed scroll wall, i.e., points on the inner arc edge of the fan ring are equidistant from an inside edge of the fixed scroll wall, and points on the outer arc edge of the fan ring are equidistant from an outside edge of the fixed scroll wall. As the prior arts adopt a cylindrical electrode, correspondingly, the prior arts adopt circularly cross-sectional micropores. But the distance between the boundary of the circular cross-section and the edge of the fixed scroll wall is extremely non-uniform, resulting in an non-uniform electrostatic field and a great field loss on the fixed scroll wall. When the present disclosure adopts the micropore having a cross-sectional shape of a fan ring, it is favorable to maintain a constant distance between the arc edge and the edge of the fixed scroll wall, which is equal to the technologically allowable minimum distance between the micropore boundary and the edge of the fixed scroll wall, thereby reducing a loss of the electric field, and maintaining uniformity of the electric field.

The present disclosure adopts the micropore having a cross-sectional shape of a fan ring, and when the etching reaches a certain depth, the micropore having a cross-sectional shape of a fan ring in the present disclosure has a larger effective area to receive the etching ion beam for a silicon deep reactive ion etching (DRIE), than the circularly cross-sectional micropore of the same radial size in the prior art, thereby reducing the difficulty in deep etching of the micropore with a high depth-to-width ratio.

The present disclosure has application prospects in a wide range of fields such as a micro-refrigerator compressor, a micro-vacuum compressor, and a precise microinjection control and drug delivery system of a micro-total analysis system.

LIST OF THE REFERENCE NUMERALS

1—scroll type micro-compressor;
2—fixed scroll plate;
3—orbit scroll plate;
4—fixed scroll plate substrate;
5—fixed scroll wall; 51—inside edge of fixed scroll wall; 52—outside edge of fixed scroll wall;
6—annular shell;
7—inlet;
8—orbit scroll plate substrate; 81—circular body portion; 82—short arm;
9—orbit scroll wall;
10—keyway;
11—insertion key;
12—fan ring-shaped micropore; 121—inner arc edge of fan ring; 122—outer arc edge of fan ring;
12'—circularly cross-sectional micropore in the prior art;
13—conductive wire;
14—pad;
15-discharge port.

DETAILED DESCRIPTION OF THE PREFERRED EMBODIMENTS

The technical solutions in the embodiments of the present disclosure will be described clearly and completely as follows with reference to the drawings in the embodiments of the present disclosure. Obviously, those described are merely parts, rather than all, of the embodiments of the present disclosure. Based on the embodiments of the present disclosure, any other embodiment obtained by those skilled in the art without paying any creative labor should fall within the protection scope of the present disclosure.

Figure 1:
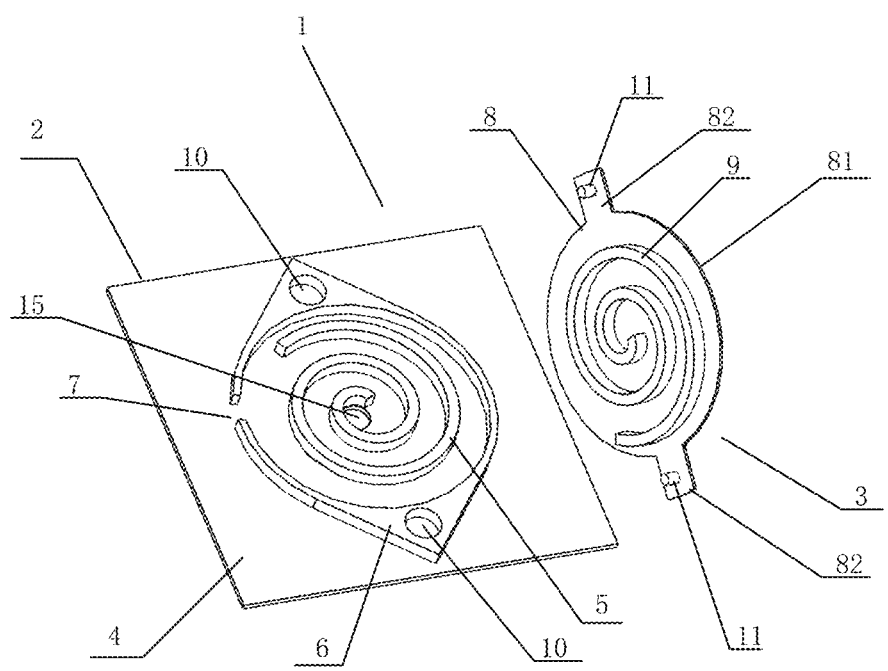
FIG. 1 is a three-dimension (3D) structural view of a scroll type micro-compressor in the present disclosure.
Figure 4:
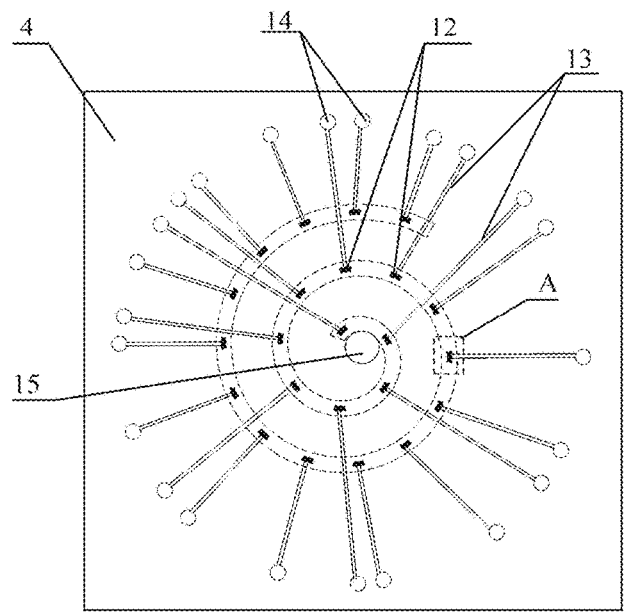
FIG. 4 is a planar view of a lower surface of a fixed scroll plate in the present disclosure.
Figures 5, 6:
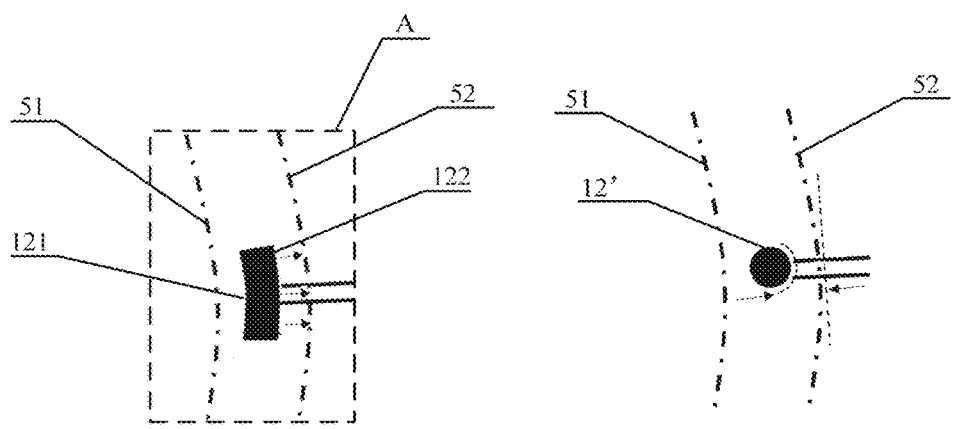
FIG. 5 is a schematic illustration of an equidistant relationship between a micropore having a cross-sectional shape of a fan ring on a lower surface of a fixed scroll plate and inside and outside edges of a fixed scroll wall in the present disclosure, i.e., a partial enlarged view of Portion A in FIG. 4.
FIG. 6 is a schematic illustration of a non-equidistant relationship between a circularly cross-sectional micropore on a lower surface of a fixed scroll plate and inside and outside edges of a fixed scroll wall in the prior art.

As shown in FIGS. 1, 4 and 5, the present disclosure proposes a scroll type micro-compressor 1 which is based on a monocrystalline silicon substrate and electrostatically driven, comprising a fixed scroll plate 2 and an orbit scroll plate 3 each integrally made with a monocrystalline silicon substrate to reduce the cost. As shown in FIG. 1, the fixed scroll plate 2 comprises: a fixed scroll plate substrate 4, a fixed scroll wall 5 and an annular shell 6 located outside the fixed scroll wall 5; the fixed scroll wall 5 is integrally formed on an upper surface of the fixed scroll plate substrate 4 to cooperate with an orbit scroll wall 9 on the orbit scroll plate 3. The fixed scroll wall 5 and the orbit scroll wall 9 are shaped as a pair of conjugated Archimedes spirals that mesh with each other. The annular shell 6 is integrally formed on the upper surface of the fixed scroll plate substrate 4 and located outside the fixed scroll wall 5, wherein a side of the annular shell 6 is provided with an inlet 7, and an upper surface of the annular shell 6 is provided with a pair of cylindrical keyways 10 radially and symmetrically distributed with respect to the fixed scroll wall 5; the two cylindrical keyways 10 and a pair of insertion keys 11 on the orbit scroll plate substrate 8 are cooperated by insertion to form an Oldham ring structure to prevent an autogiration of the orbit scroll plate 3.

As shown in FIG. 4, in an embodiment of the present disclosure, a plurality of micropores 12 uniformly distributed along the fixed scroll wall 5 are provided to extend from a lower surface of the fixed scroll plate substrate 4 into the fixed scroll wall 5 through the fixed scroll plate substrate 4; each of the micropores 12 is filled with an electrode material for electrostatic driving and connected by a wire 13 to a pad 14 provided respectively on the lower surface of the fixed scroll plate substrate 4 and close to an edge of the fixed scroll plate substrate 4; the electrode material is charged by the wire 13 to generate an electrostatic force. On the one hand, the electrostatic force laterally attracts the orbit scroll wall 9 toward the fixed scroll wall 5, so that a crescent-shaped closed region is formed between a sidewall of the orbit scroll wall 9 and a sidewall of the fixed scroll wall 5. On the other hand, the electrostatic force presses a top surface of the orbit scroll wall 9 against the upper surface of the fixed scroll plate substrate 4, and presses a top surface of the fixed scroll wall 5 against the upper surface of the orbit scroll plate substrate 8, so that upper and lower surfaces of the crescent-shaped region are closed, thereby forming a fully closed pressure bag. In this embodiment, as shown in FIG. 5, a cross-sectional shape of the micropore 12 is a fan ring, an inner arc edge 121 of the fan ring is parallel to an inside edge 51 of the fixed scroll wall 5, points on the inner arc edge 121 of the fan ring are equidistant from the inside edge 51 of the fixed scroll wall 5, an outer arc edge 122 of the fan ring is parallel to an outside edge 52 of the fixed scroll wall 5, and points on the outer arc edge 122 of the fan ring are equidistant from the outside edge 52 of the fixed scroll wall 5, thereby making the electric field be uniform and reducing the electric field loss. Further, the plurality of micropores 12 are uniformly distributed along a spiral line that is equidistant from the inside edge 51 of the fixed scroll wall 5, so that the electrode material in each of the micropores 12 equidistant from the inner arc edge 121 of the fan ring, and also equidistant from the outer arc edge 122 of the fan ring, thereby ensuring the uniform electric field on both sides of the axis of the micropore 12. Preferably, the plurality of micropores 12 are uniformly distributed along a central line of the fixed scroll wall 5, so that the electrode material in each of the micropores 12 is equidistant from the inner arc edge 121 and the outer arc edge 122 of the fan ring, thereby further ensuring the uniform electric field.

As shown in FIG. 6, in the prior art, micropore having a circular cross-section is used for filling of the electrode material, and the distance between the boundary of the circular cross-section and the inside edge 51 of the fixed scroll wall or the outside edge 52 of the fixed scroll wall is extremely non-uniform, which results in a non-uniform electrostatic field and a large field loss on the fixed scroll wall 5. Compared with the prior art, the present disclosure adopts the micropore having a cross-sectional shape of a fan ring, it is helpful to keep an arc edge of the fan ring being equidistant from an edge of the adjacent fixed scroll wall to sustain a uniform electric field, thereby achieving the effects of maintaining the uniformity of the electrostatic drive electric field and reducing the loss of the electric field.

In addition, as shown in FIGS. 5 and 6, the prior art adopts a circular micropore to be filled with an electrode material, and the edges of the circular micropore can only ensure a minimum distance allowed by the technology at a center point, while the distance between the edge of the micropores on either side of the center point and the edge of the scroll wall increases rapidly, which causes a voltage loss and a highly non-uniform electric field. In addition, compared with the circular micropore, the fan ring-shaped micropore 12 can have a larger effective area for receiving the etching ion beam after that the DRIE etching reaches a certain depth, so it is easier to continue etching in the depth direction. That is, since the design of a micropore having a cross-sectional shape of a fan ring is adopted, during the fabrication of the fixed scroll plate of the present disclosure, when the etching reaches a certain depth, the micropore having a cross-sectional shape of a fan ring in the present disclosure has a larger effective area to receive the etching ion beam for a silicon deep reactive ion etching (DRIE), than the circularly cross-sectional micropore of the same radial size in the prior art, thereby reducing the difficulty in deep etching of the micropore with a high depth-to-width ratio. Preferably, the distance between an arc edge of the fan ring and an edge of the adjacent fixed scroll wall is designed as a minimum distance allowed by the technology. In addition, a through-hole is provided on the fixed scroll plate substrate 4 and at a center of the fixed scroll wall 5 as a discharge port of the compressed medium (liquid/gas).

The working mechanism of the electrostatically driven scroll type micro-compressor is that when the conductive electrodes are sequentially excited, the orbit scroll wall 9 performs periodic eccentric motions without autogiration under the action of the electrostatic driving force, and the compressed medium is enclosed in a closed crescent-shaped pressure bag formed between the fixed scroll plate 2 and the orbit scroll plate 3. The pressure bag gradually contracts toward the center as the orbit scroll wall 9 moves, and the internal pressure increases, thereby continuously pumping the medium in the pressure bag from a low-pressure region to a high-pressure region and discharging it from the discharge port 15.

Figure 3:
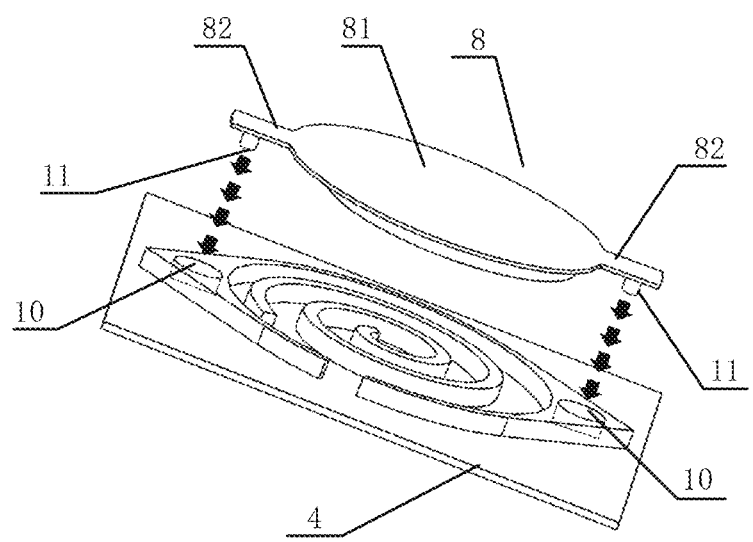
FIG. 3 is a 3D structural view of a scroll type micro-compressor in the present disclosure having an Oldham ring structure and adopting a shape design of an optimized orbit scroll plate substrate.
Figure 3A:
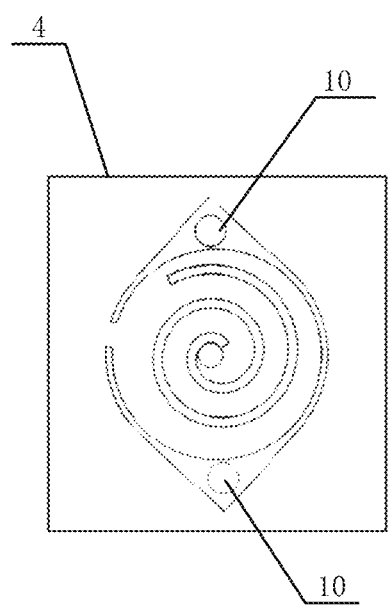
FIG. 3*a* is a planar view of an upper surface of a fixed scroll plate in FIG. 3.
Figure 3B:
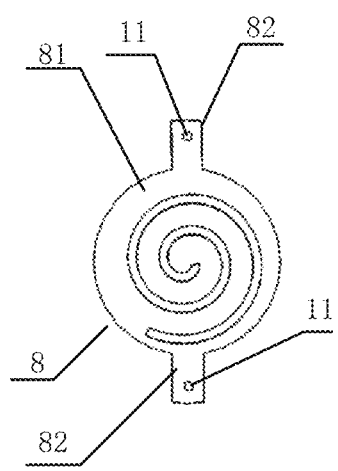
FIG. 3*b* is a planar view of an upper surface of an orbit scroll plate in FIG. 3.

As shown in FIGS. 3, 3a and 3b, in an embodiment of the present disclosure, the orbit scroll plate 3 comprises an orbit scroll plate substrate 8 and an orbit scroll wall 9 provided on an upper surface thereof; the orbit scroll plate substrate 8 comprises a circular body portion 81 and a pair of short arms 82 coplanar with the circular body portion 81 and provided to radially extend from two ends of a diameter of the circular body portion 81, either of the two short arms 82 being provided with a raised cylindrical insertion key 11; a distance between central axes of the two cylindrical insertion keys 11 is equal to a distance between central axes of the two cylindrical keyways 10, and a cross-sectional diameter of the cylindrical insertion key 11 is smaller than a cross-sectional diameter of the cylindrical keyway 10, so that the insertion key 11 is inserted into the keyway 10 to prevent an autogiration of the orbit scroll plate 3. In this embodiment, the insertion key 11 and the keyway 10 are both cylindrical, but they may also adopt an elliptical column, a triangular prism, a quadrangular prism or other suitable shape, and an equivalent substitution of any shape capable of preventing an autogiration of the orbit scroll plate 3 should fall within the protection scope of the present disclosure.

In an embodiment of the present disclosure, the orbit scroll plate 3 is made of a monocrystalline silicon substrate, and as shown in FIG. 1, the orbit scroll plate substrate 8 and the orbit scroll wall 9 are integrally formed, so that the structure of the orbit scroll plate 3 is more robust.

In an embodiment of the present disclosure, the fixed scroll plate substrate 4 adopts a shape that can be directly cut by dicing to facilitate the technological machining. Preferably, a square or a rectangle is adopted.

Figure 8A:
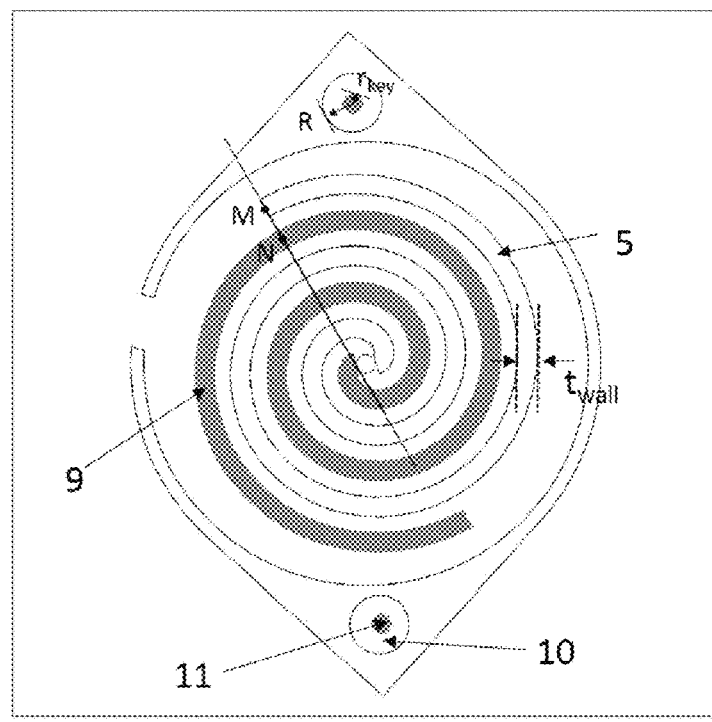
FIG. 8*a* is a view of a combined structure of a scroll type micro-compressor having an Oldham ring structure when an orbit scroll wall is in an open state in the present disclosure.
Figure 8B:
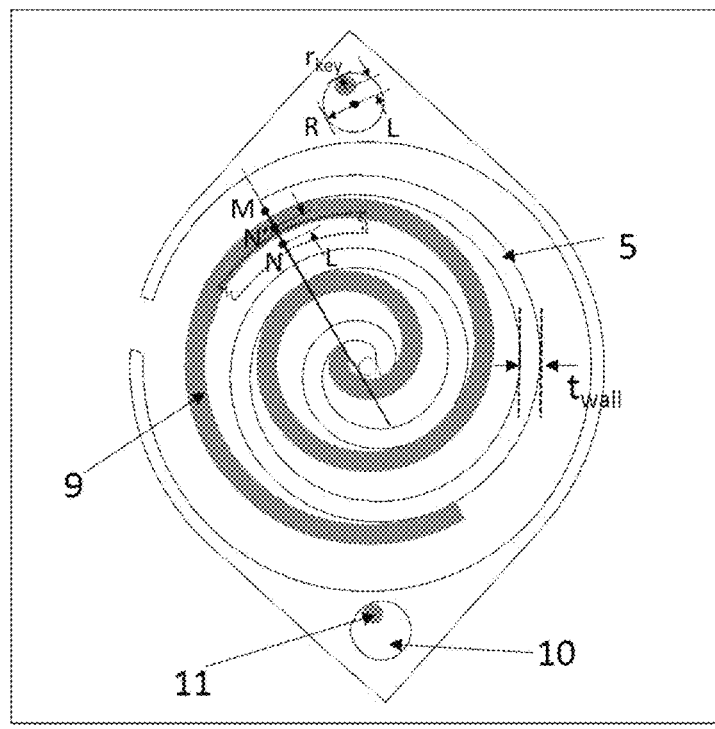
FIG. 8*b* is a view of a combined structure of a scroll type micro-compressor having an Oldham ring structure when circle centers of an orbit scroll wall and a fixed scroll wall are ectopic in the present disclosure.

As shown in FIG. 8a, when the orbit scroll wall 9 is in an open state, the central axis of the insertion key 11 coincides with the central axis of the keyway 10. As shown in FIG. 8b, when the orbit scroll wall 9 translates for a closure with the fixed scroll wall 5, the Oldham ring insertion key 11 on the orbit scroll plate 3 translates for a same distance L from a center of a cross-section of the keyway 10 along a circular cross-sectional radius of the keyway 10. Ideally (the wall thicknesses of the orbit scroll wall 9 and the fixed scroll wall 5 are omitted), the orbit scroll wall 9 translates for a distance of for a closure with the fixed scroll wall 5. When considering the wall thickness of the fixed scroll wall 5 as $t_{wall}$, the moving distance (NN') is less than an ideal case (MN) by $t_{wall}$, that is, a superposition of the half thicknesses of the orbit scroll wall 9 and the fixed scroll wall 5. A cross-sectional radius R of the Oldham ring keyway 10 and a cross-sectional radius $r_{key}$ of the insertion key 11 should ensure that the insertion key can move in the keyway without obstructing the contact between the fixed scroll wall 5 and the orbit scroll wall 9, and should satisfy the following constraint:

$$R - r_{key} \geq \pi r_0 - t_{wall}$$

wherein, $r_0$ is an initial radius of the orbit scroll wall 9, i.e., a distance from a start point to a center of the orbit scroll wall 9;

$t_{wall}$ is a radial thickness of the fixed scroll wall 5, and equal to a radial thickness of the orbit scroll wall 9.

Figure 2:
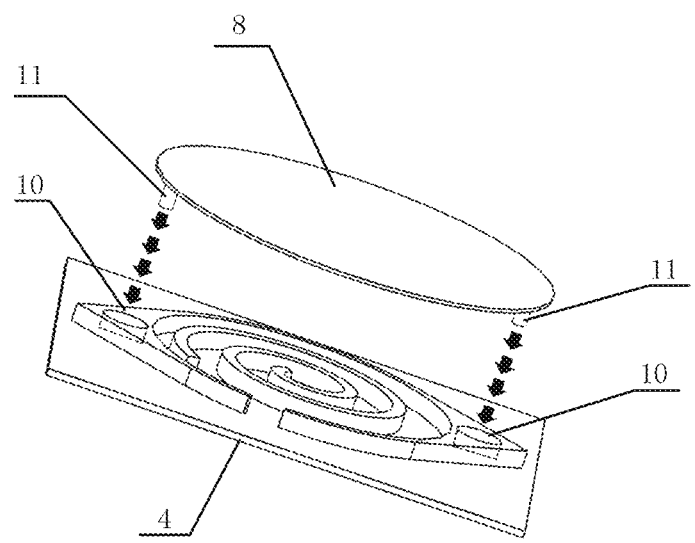
FIG. 2 is a 3D structural view of a scroll type micro-compressor in the present disclosure having an Oldham ring structure and adopting a shape design of a conventional circular orbit scroll plate substrate.
Figure 2A:
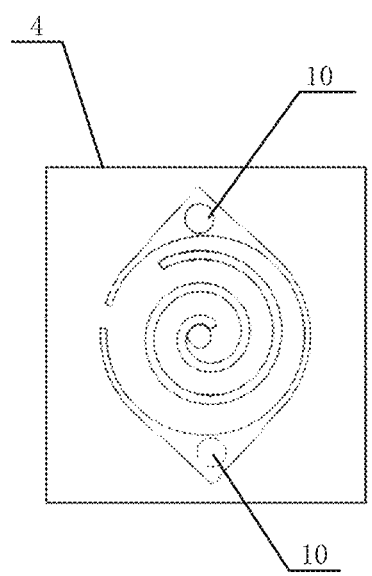
FIG. 2*a* is a planar view of an upper surface of a fixed scroll plate in FIG. 2.
Figure 2B:
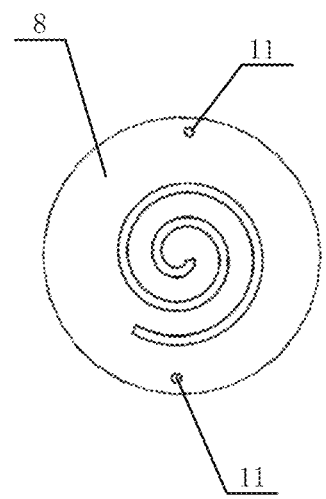
FIG. 2*b* is a planar view of an upper surface of an orbit scroll plate in FIG. 2.

As shown in FIGS. 2, 2a and 2b, the disc-shaped orbit scroll plate substrate 8 adopts a large radius, and actually the area of such orbit scroll plate substrate 8 is redundant for the sealing of the compression regions between the orbit scroll plate and the fixed scroll plate during the operation of the compressor. As a further improvement of the present disclosure, as shown in FIGS. 3 and 3b, the circular body portion 81 of the orbit scroll plate substrate 8 is minimized, i.e., the minimized circular body portion 81 is connected to a pair of radially symmetric coplanar short arms 82 for accommodating the Oldham ring insertion key 11. Since the orbit scroll plate substrate 8 has the short arms 82 provided as radially symmetric, most of the area of the circular ring corresponding to either short arm 82 in the radial direction of the orbit scroll plate substrate 8 is removed, thereby reducing the actual area of the circular body portion 81, and achieving an optimized design. Thus, the area of the orbit scroll plate substrate 8 can be minimized, so as to reduce the mass of the orbit scroll plate 3, and then reduce the mass of the load under electrostatically driving.

Figure 7A:
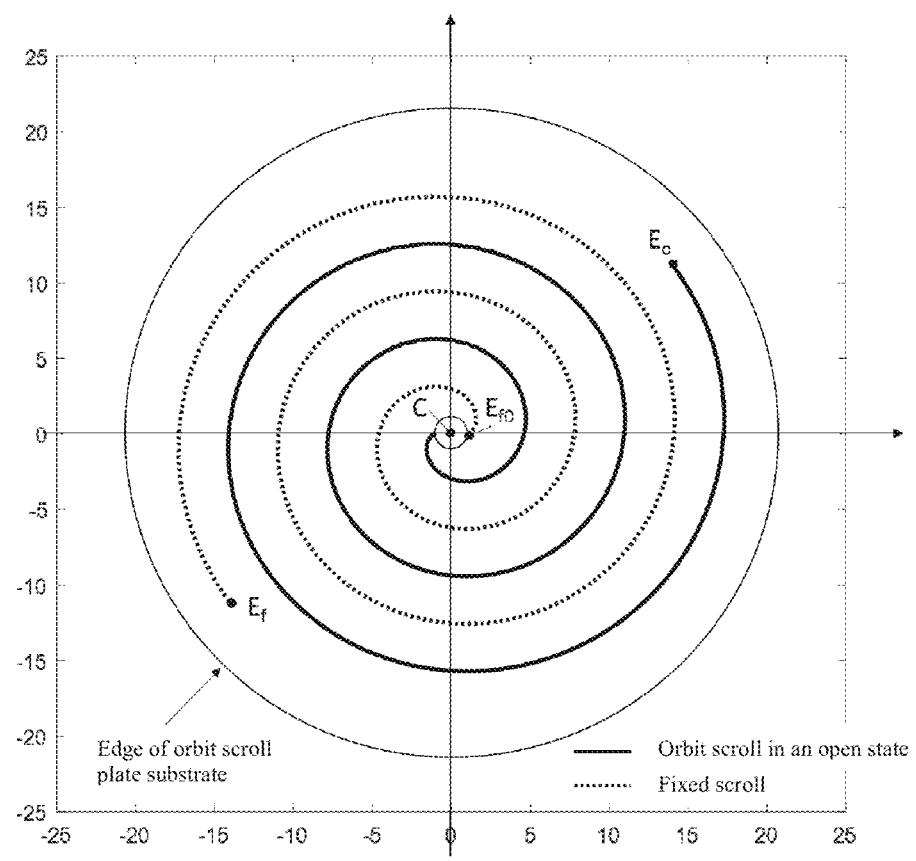
FIG. 7*a* is a view of a minimum radius of an orbit scroll plate substrate when an orbit scroll wall is in an open state in the present disclosure.
Figure 7B:
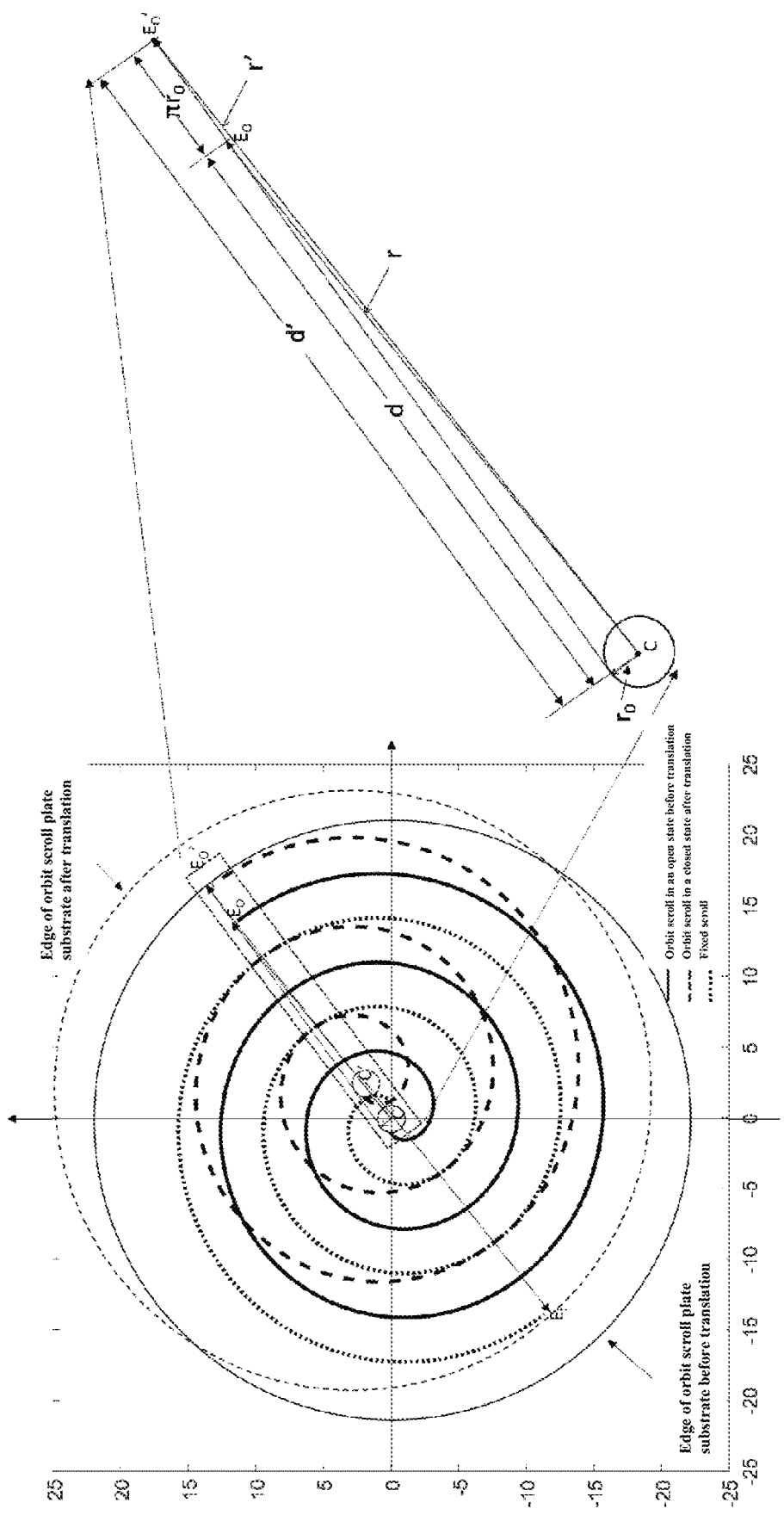
FIG. 7*b* is a view of a minimum radius of an orbit scroll plate substrate when circle centers of an orbit scroll wall and a fixed scroll wall are ectopic in the present disclosure.

As shown in FIG. 7a, when the orbit scroll wall 9 is in the open state, a circle center of the orbit scroll plate substrate 8, a circle center of the orbit scroll wall 9, and a circle center of the fixed scroll wall 5 coincide at an origin C. As shown in FIG. 7b, with respect to the orbit scroll wall 9 having a tail end angle of θ and an initial radius of $r_0$, the coordinates of a tail end point $E_0$ are x=$-r_0(\cos(\theta)+\theta \sin(\theta))$ and y=$-r_0(\sin(\theta)-\theta \cos(\theta))$. Therefore, a distance r from the tail end point $E_0$ of the orbit scroll wall 9 to the origin C can be calculated:

$$r = r_0\sqrt{1+\theta^2}$$

As shown in FIG. 7b, when the orbit scroll plate substrate 8 is designed with a minimized radius, the orbit scroll plate 3 translates for a distance of $\pi r_0$ along a line passing through the tail end point $E_0$ of the orbit scroll wall 9 and being tangent line of a circle that is centered at the origin C and has a radius of $r_0$, to reach a closed state. After translation, the tail end point of the orbit scroll wall 9 translates to a point $E_0'$, and the circle center of the orbit scroll plate substrate 8 and the circle center of the orbit scroll wall 9 translates to a point C'. In this closed state, a distance between a tail end point $E_f$ of a maximum radius of the fixed scroll wall 5 (i.e., an end point corresponding to the tail end angle θ of the scroll wall; as shown in FIG. 7a, the tail end angle θ is a rotation angle from a start point $E_{f0}$ to the tail end point $E_f$ of the fixed scroll wall 5) and the circle center of the orbit scroll plate substrate 8 is the farthest, and the radius of the orbit scroll plate substrate 8 should still cover the tail end point $E_f$ of the fixed scroll wall 5. According to the Pythagorean theorem, a distance d from a tangent point of a tangent line along which the translation is performed, to an initial position $E_0$ of the tail end point of the orbit scroll wall 9 can be calculated.

$$d = \theta r_0$$

The orbit scroll wall 9 translates along the tangent line for a distance of $\pi r_0$, so a distance d' between the tail end point $E_0'$ of the orbit scroll wall 9 and the tangent point after translation is:

$$d' = (\theta+\pi)r_0$$

Since the right-angle side d' of the right-angled triangle and $r_0$ are known, a distance r' between the tail end point $E_0'$ of the orbit scroll wall 9 and the origin C is calculated according to the Pythagorean theorem:

$$r' = r_0\sqrt{1+(\theta+\pi)^2}$$

According to the symmetry of the initial states of the orbit scroll wall 9 and the fixed scroll wall 5 with respect to the origin and the translational property of the orbit scroll wall 9, it is known that a triangle which connects the origin C, the circle center C' of the orbit scroll wall 9 after translation, and the tail end point $E_0'$ of the orbit scroll wall 9 after translation, is similar to a triangle which connects the origin C, the circle center C' of the orbit scroll wall 9 after translation, and the tail end point $E_f$ of the fixed scroll wall 5. Thus, the distance between the circle center C' of the orbit scroll wall 9 after translation and the tail end point $E_f$ of the fixed scroll wall 5 is also r'. The diameter of the orbit scroll plate substrate should enable the orbit scroll plate substrate after translation to still cover the tail end point $E_f$ of the fixed scroll wall 5, and the thickness $t_{wall}$ of the scroll wall in actual machining should be considered. The minimum radius $r_{min}$ of the orbit scroll plate substrate should satisfy the following constraint:

$$r_{min} > r - \frac{t_{wall}}{2} = r_0\sqrt{1+(\theta+\pi)^2} - \frac{t_{wall}}{2}$$

Thus, the substrate of the orbit scroll plate 3 as shown in FIG. 3 is constituted by connecting a pair of radially symmetric coplanar short arms 82 with a circle having a minimum radius, both ends of the short arm 82 accommodating the Oldham ring insertion key 11 on the orbit scroll plate substrate. Such a design reduces the mass of the load of the electrostatically driven orbit scroll plate 3.

In summary, the radius $r_{min}$ of the minimized circular body portion of the orbit scroll plate substrate 8 satisfies the following constraint:

$$r_{min} > r_0\sqrt{1+(\theta+\pi)^2} - t_{wall}/2$$

wherein, $r_0$ is an initial radius of the orbit scroll wall 9, i.e., a distance from a start point to a center of the orbit scroll wall 9;

$\theta$ is an angle from the start point to a tail end of the orbit scroll wall 9;

$t_{wall}$ is a radial thickness of the orbit scroll wall 9, and equal to a radial thickness of the fixed scroll wall 5.

As shown in FIG. 1, in an embodiment of the present disclosure, the fixed scroll plate 2 and the orbit scroll plate 3 are subjected to surface treatments, so that the upper surfaces of the fixed scroll plate substrate 4 and the orbit scroll plate substrate 8 and sidewall surfaces of the fixed scroll wall 5 and the orbit scroll wall 9, i.e., inner walls of a compressor chamber, are hydrophilic, which is favorable for limiting the liquid medium within the compression chamber, thereby improving the compression efficiency. In addition, top surfaces of the fixed scroll wall 5 and the orbit scroll wall 9 are hydrophobic, and the hydrophobic treatment thereof is helpful to limit the top leakage caused by the capillary action thereof. In addition, the hydrophilicity of the inner wall of the compression chamber is favorable for the filling and the inner wall modification of the compression chamber by the capillary action. The method for the hydrophilic surface treatment includes, but not limited to, the silica deposition; and the hydrophobic surface treatment includes, but not limited to, grinding polished silicon, applying hydrophobic polymer coating, and the like.

The present disclosure further provides a method for machining the fixed scroll plate 2 in the scroll type microcompressor 1 aforementioned, comprising the following steps of:

Step 1: defining the micropores 12 for filling of electrode on a lower surface of a monocrystalline silicon wafer by photolithography, and etching the micropore 12 to a designated depth by anisotropic etching, wherein the designated depth is ranged from 300 to 500 μm, but not limited thereto, and an appropriate depth may also be selected according to actual needs.

These pores are embedded into the fixed scroll wall by silicon deep reactive ion etching (DRIE) for filling of a conductive electrode material that generates an electrostatic driving force. Each of the embedded electrodes is connected to a pad 14 close to an edge of the substrate by a conductive wire 13 on a lower surface of the substrate, so as to receive a voltage excitation to generate an electrostatic field. The through-hole passing through the center of the fixed scroll plate substrate serves as a discharge port 15 for the compressed medium (liquid/gas). The radial size of the micropore 12 for filling of electrode material should be maximized relative to the thickness of the scroll wall to reduce the loss of the electrostatic driving voltage passing through the scroll wall. The minimum distance between the edge of the micropore and the edge of the scroll wall is limited by the technological conditions, such as the photolithography accuracy, the perpendicularity of DRIE high depth-to-width ratio etching, etc.

Step 2: defining shapes of the fixed scroll wall 5, the shell 6 and the Oldham ring keyway 10 on an upper surface of the monocrystalline silicon wafer by photolithography, and subsequently anisotropic etching to a designated depth using silicon DRIE;

Step 3: performing an insulation layer conformal deposition or oxidation for the upper surface and the lower surface of the monocrystalline silicon wafer and inner surface of the micropore 12;

Step 4: depositing a conductive material on a lower surface of the monocrystalline silicon wafer to fill the micropores 12 to form embedded electrodes;

Step 5: defining shapes of wires 13 and pads 14 on the lower surface of the monocrystalline silicon wafer by photolithography, and etching a conductive material layer using reactive-ion etching (RIE) to form the wires 13 and the pads 14.

Preferably, the conductive material is polysilicon.

Figure 9:
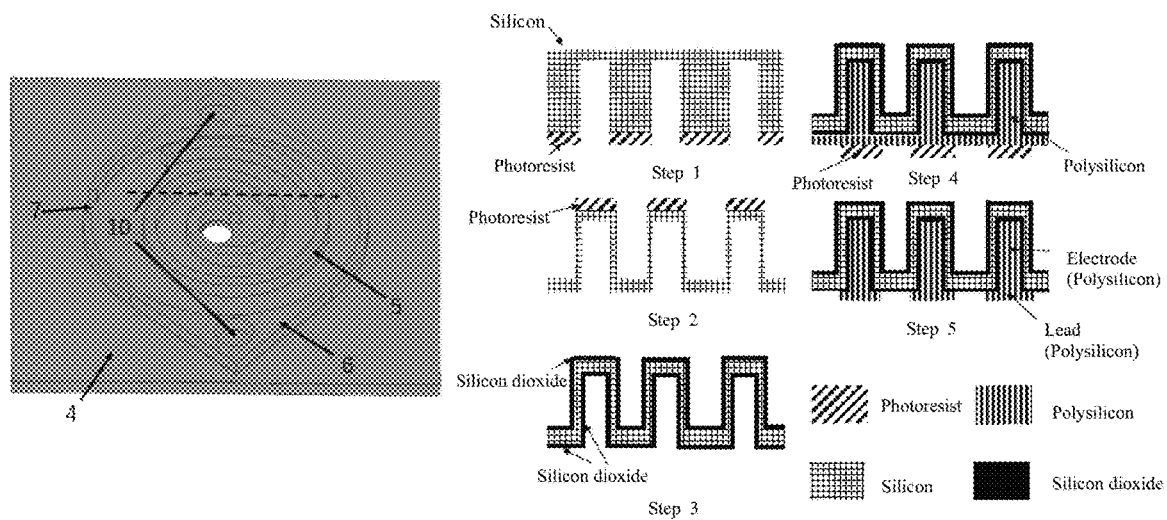
FIG. 9 is a flowchart of a micro-machining technological process of a fixed scroll plate of a scroll type micro-compressor based on a monocrystalline silicon substrate in the present disclosure.

In an embodiment of the present disclosure, a fixed scroll plate in the left of FIG. 9 is taken as an example. Cross-sections in the right of FIG. 9 corresponding to the dotted cutting line in the left of FIG. 9 demonstrate respective technological steps, comprising:

Step 1: defining micropores 12 for filling of electrode on a lower surface (non-polished surface) of a single-side polished silicon wafer by photolithography, and performing anisotropic deep etching of a lower surface of a silicon substrate by a deep reactive ion etching (DRIE).

Step 2: defining shapes of the fixed scroll wall 5, the shell 6 and the Oldham ring keyway 10 on an upper surface (polished surface) of the silicon wafer by performing a second photolithography, and then etching to a designated depth by the DRIE.

Step 3: after removing a photoresist, depositing or oxidizing an entire surface of the monocrystalline silicon wafer, including inner walls of the micropores 12 extending from a lower surface, to form a silicon dioxide insulation thin layer.

Step 4: depositing polysilicon on the micropores 12 and the lower surface of the silicon wafer.

Step 5: defining the wires and pad pattern on the lower surface by performing a third photolithography, and then forming the wires 13 and the pads 14 by a reactive ion etching (RIE) of the polysilicon.

The present disclosure further provides a method for machining the orbit scroll plate 3 in the scroll type microcompressor 1, comprising the steps of:

defining shapes of the orbit scroll wall 9 and the Oldham ring insertion key 11 on an upper surface of a monocrystalline silicon wafer by photolithography, and then performing anisotropic silicon-etching to a designated depth, wherein the designated depth is ranged from 300 to 500 μm, but not limited thereto, and an appropriate depth may also be selected according to actual needs.

defining a shape of the orbit scroll plate substrate 8 outlined by a narrow channel on a lower surface of the monocrystalline silicon wafer by photolithography, and releasing the orbit scroll plate 3 entirely by anisotropic silicon-etching through the monocrystalline silicon wafer.

Figure 10:
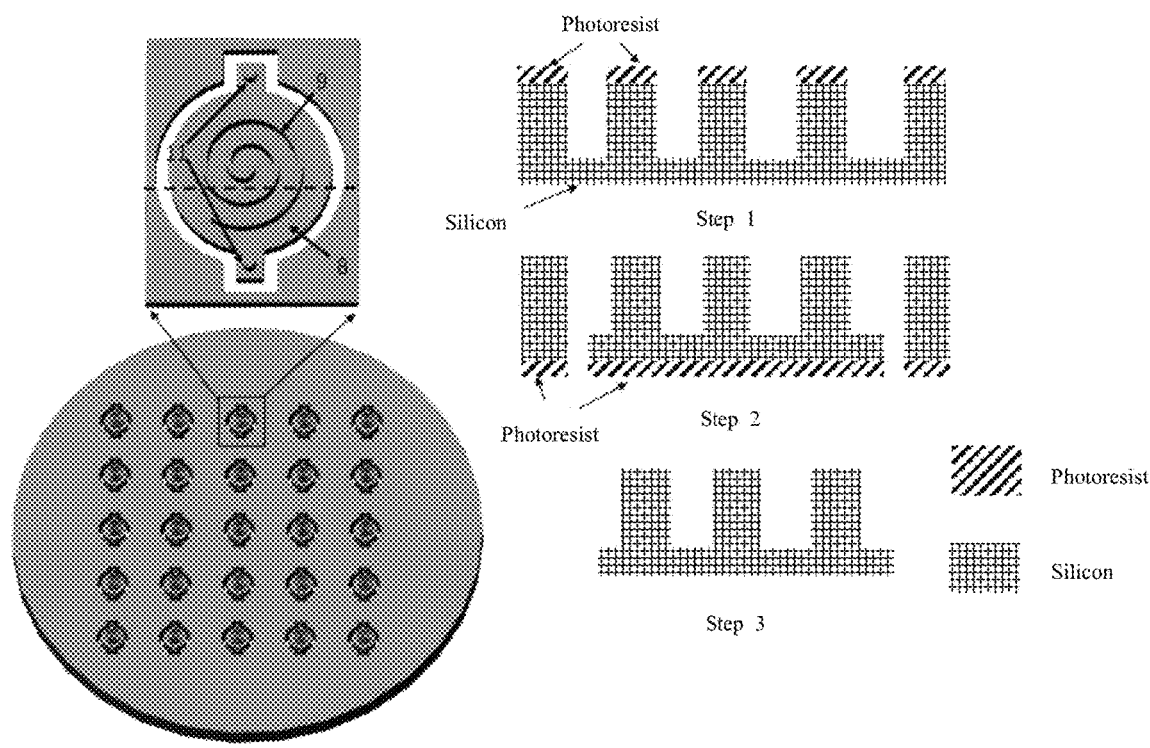
FIG. 10 is a flowchart of a micro-machining technological process of an orbit scroll plate of a scroll type micro-compressor based on a monocrystalline silicon substrate in the present disclosure.

In an embodiment of the present disclosure, an orbit scroll plate in the upper left of FIG. 10 is taken as an example. Cross-sections in the right of FIG. 10 corresponding to the dotted cutting line in the upper left FIG. 10 demonstrate respective technological steps, comprising:

Step 1: defining shapes of an orbit scroll wall 9 and an Oldham ring insertion key 11 on an upper surface (polished surface) of a single-side polished monocrystalline silicon wafer, and then etching a scroll wall by a DRIE.

Step 2: defining a shape of an orbit scroll plate substrate 8 by photolithography of a pattern of a narrow channel on a lower surface (non-polished surface) of the monocrystalline silicon wafer, and then performing anisotropic etching of the narrow channel;

Step 3: etching the substrate through to release the orbit scroll plate entirely.

The present disclosure has been explained in detail with the foregoing embodiments, in order to fully understand features for providing these enhancements and the operational improvements. In addition, it can be understood that these additional structural features and the operational improvements may be used alone, or in combination with each other and with all of the features and elements described above and the description of the embodiments illustrated in the drawings. Therefore, it should be understood that the present disclosure is not limited to any specific feature, element or combinations thereof, and any desired combination of features described herein can be practiced without departing from the protection scope of the present disclosure.

What is claimed is:

1. A scroll type micro-compressor, comprising:
a fixed scroll plate and an orbit scroll plate, each integrally made with a monocrystalline silicon substrate;
wherein the fixed scroll plate further comprises:
  a fixed scroll plate substrate;
  a fixed scroll wall integrally formed on an upper surface of the fixed scroll plate substrate; and
  an annular shell integrally formed on the upper surface of the fixed scroll plate substrate and located outside the fixed scroll wall, wherein a side of the annular shell is provided with an inlet, and an upper surface of the annular shell is provided with a pair of cylindrical keyways radially and symmetrically distributed with respect to the fixed scroll wall;
wherein a plurality of micropores uniformly distributed along the fixed scroll wall are provided to extend from a lower surface of the fixed scroll plate substrate into the fixed scroll wall through the fixed scroll plate substrate, the micropores being filled with electrode materials connected by wires to pads provided respectively on the lower surface of the fixed scroll plate substrate and close to edges of the fixed scroll plate substrate, a cross-sectional shape of the micropore being a fan ring, points on an inner arc edge of the fan ring being equidistant from an inside edge of the fixed scroll wall, and points on an outer arc edge of the fan ring being equidistant from an outside edge of the fixed scroll wall;
and wherein a through-hole is provided on the fixed scroll plate substrate and at a center of the fixed scroll wall as a discharge port;
wherein the orbit scroll plate further comprises:
  an orbit scroll plate substrate, comprising a circular body portion and a pair of short arms coplanar with the circular body portion and provided to radially extend from two ends of a diameter of the circular body portion, either of the two short arms being provided with a raised cylindrical insertion key; and
  an orbit scroll wall provided on an upper surface of the orbit scroll plate substrate;
and wherein a distance between central axes of the two cylindrical insertion keys is equal to a distance between central axes of the two cylindrical keyways, and a cross-sectional diameter of the cylindrical insertion key is smaller than a cross-sectional diameter of the cylindrical keyway, so that the insertion key is inserted into a corresponding keyway, and wherein the insertion key and the keyway form an Oldham ring structure to prevent an autogyration of the orbit scroll plate.

2. The scroll type micro-compressor as set forth in claim 1, wherein the orbit scroll plate is made of a monocrystalline silicon substrate, and the orbit scroll plate substrate and the orbit scroll wall are integrally formed.

3. A method for machining the orbit scroll plate in the scroll type micro-compressor as set forth in claim 2, comprising the steps of:
defining shapes of the orbit scroll wall and the Oldham ring insertion key on an upper surface of a monocrystalline silicon wafer by photolithography, and subsequently performing anisotropic silicon-etching to a designated depth;
defining a shape of the orbit scroll plate substrate outlined by a narrow channel on a lower surface of the monocrystalline silicon wafer by photolithography, and releasing the orbit scroll plate entirely by anisotropic silicon-etching through the wafer.

4. The scroll type micro-compressor as set forth in claim 1, wherein the fixed scroll plate substrate has a shape that can be directly cut by dicing.

5. The scroll type micro-compressor as set forth in claim 4, wherein the fixed scroll plate substrate is square or rectangular.

6. The scroll type micro-compressor as set forth in claim 1, wherein a radius R of the keyway and a radius $r_{key}$ of the insertion key satisfy the following constraint:

$$R = r_{key} \geq \pi r_0 - t_{wall},$$

wherein $r_0$ is an initial radius of the orbit scroll wall, the initial radius being a distance from a start point to a center of the orbit scroll wall; and
wherein $t_{wall}$ is a radial thickness of the fixed scroll wall, and equal to a radial thickness of the orbit scroll wall.

7. The scroll type micro-compressor as set forth in claim 1, wherein the circular body portion of the orbit scroll plate substrate is minimized to reduce a mass of the orbit scroll plate, thereby reducing an electrostatic drive load.

8. The scroll type micro-compressor as set forth in claim 7, wherein a radius $r_{min}$ of the circular body portion of the orbit scroll plate substrate satisfies the following constraint:

$$r_{min} > r_0 \sqrt{1 + (\theta + \pi)^2} - t_{wall}/2$$

wherein,
$r_0$ is an initial radius of the orbit scroll wall, the initial radius being a distance from a start point to a center of the orbit scroll wall;
$\theta$ is an angle from the start point to a tail end of the orbit scroll wall;
$t_{wall}$ is a radial thickness of the orbit scroll wall, and equal to a radial thickness of the fixed scroll wall.

9. The scroll type micro-compressor as set forth in claim 1, wherein the fixed scroll plate and the orbit scroll plate are subjected to surface treatments, so that the upper surfaces of the fixed scroll plate substrate and the orbit scroll plate substrate and sidewall surfaces of the fixed scroll wall and the orbit scroll wall are hydrophilic, while top surfaces of the fixed scroll wall and the orbit scroll wall are hydrophobic.

10. The scroll type micro-compressor as set forth in claim 1, wherein the plurality of micropores are uniformly distributed along a spiral line being equidistant to the inside edge of the fixed scroll wall.

11. A method for machining the fixed scroll plate in the scroll type micro-compressor as set forth in claim 1, comprising the steps of:
- defining the micropores for filling of electrode on a lower surface of a monocrystalline silicon wafer by photo-etching, and etching the micropore to a designated depth by anisotropic etching;
- defining shapes of the fixed scroll wall, the shell and the Oldham ring keyway on an upper surface of the monocrystalline silicon wafer by photolithography, and anisotropic etching to a designated depth;
- performing an insulation layer conformal deposition or oxidation for the upper surface and the lower surface of the monocrystalline silicon wafer and inner surface of the micropore;
- depositing a conductive material on the lower surface of the monocrystalline silicon wafer to fill the micropores to form embedded electrodes;
- defining shapes of the wires and pads on the lower surface of the monocrystalline silicon wafer by photolithography, and then performing ion-reactive etching on a conductive material layer to form the wires and the pads.

12. The method as set forth in claim 11, wherein the conductive material is polysilicon.

* * * * *